United States Patent [19]
Johnson et al.

[11] 4,242,598
[45] Dec. 30, 1980

[54] TEMPERATURE COMPENSATING TRANSISTOR BIAS DEVICE

[75] Inventors: Joseph H. Johnson; Lee B. Max, both of Sunnyvale, Calif.

[73] Assignee: Varian Associates, Inc., Palo Alto, Calif.

[21] Appl. No.: 511,882

[22] Filed: Oct. 2, 1974

Related U.S. Application Data

[63] Continuation of Ser. No. 337,783, Mar. 5, 1973, abandoned.

[51] Int. Cl.³ .............................................. H03F 3/04
[52] U.S. Cl. ...................................... 307/310; 307/297; 330/289; 357/28; 357/81; 357/86
[58] Field of Search ............... 307/310, 296 R, 297; 330/22, 23, 40, 143, 256, 289, 296; 357/28, 81, 86

[56] References Cited

U.S. PATENT DOCUMENTS

| | | | |
|---|---|---|---|
| 3,286,138 | 11/1966 | Shockley | 307/310 |
| 3,289,105 | 11/1966 | Funfstuck | 307/310 |
| 3,358,152 | 12/1967 | Alexakis | 307/310 |
| 3,585,511 | 6/1971 | Schatter et al. | 307/310 |
| 3,649,872 | 3/1972 | Garboushian | 357/74 |

OTHER PUBLICATIONS

GE Transistor Manual, 7th Edition (1964), pp. 106-107.

*Primary Examiner*—William D. Larkins
*Attorney, Agent, or Firm*—Stanley Z. Cole; Harry E. Aine; Edward H. Berkowitz

[57] ABSTRACT

The base-to-emitter bias voltage and current of a high frequency transistor, operating class AB or class A, is derived from a semiconductive bias device consisting of a semiconductive diode junction fed with current from a constant current source to derive a $V_{BE}$ voltage thereacross which is the bias source voltage. This source voltage is applied across the base-to-emitter junction of the RF transistor via the intermediary of a positive temperature coefficient silicon resistor. The diode and silicon resistor are packaged together for mounting on a heat sink common to the transistor, whereby the transistor is compensated for temperature dependent changes in $V_{BE}$ and $h_{FE}$.

18 Claims, 11 Drawing Figures

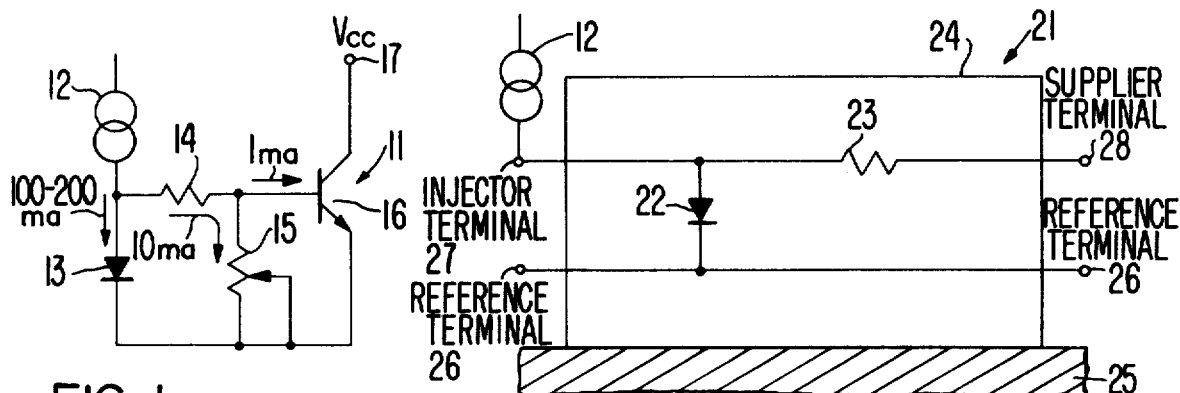
FIG. 1 PRIOR ART
FIG. 2
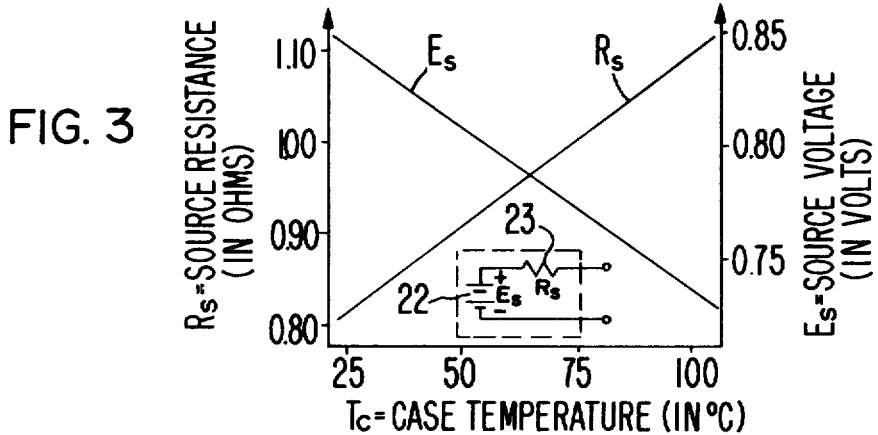
FIG. 3
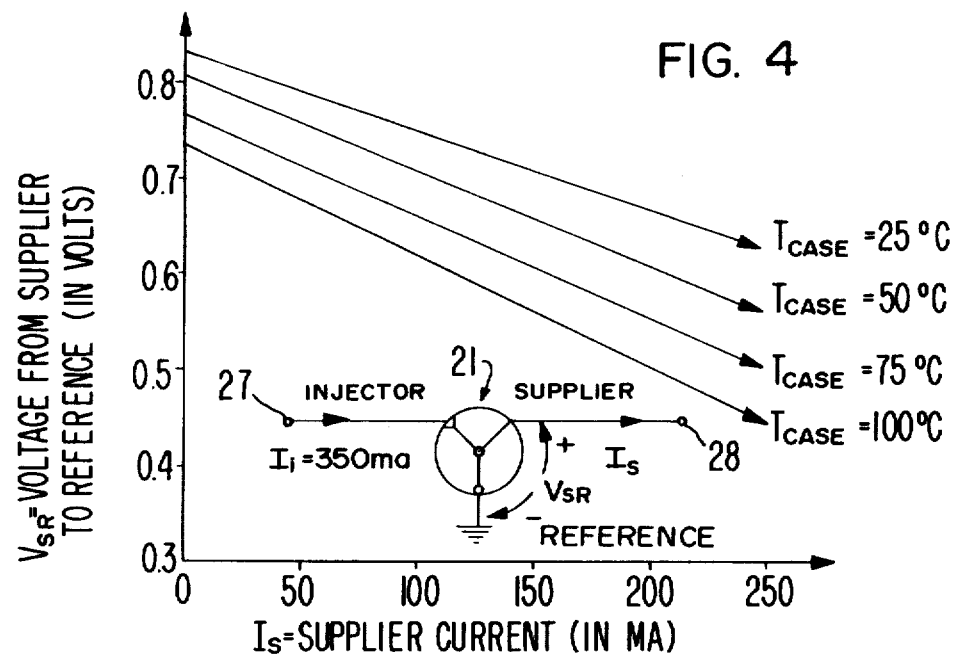
FIG. 4

TEMPERATURE COMPENSATING TRANSISTOR BIAS DEVICE

This is a continuation of application Ser. No. 337,783, filed Mar. 5, 1973 now abandoned.

BACKGROUND OF THE INVENTION

The present invention relates in general to transistor bias networks and more particularly to an improved temperature compensating transistor bias network and device.

DESCRIPTION OF THE PRIOR ART

Heretofore, high frequency RF transistor amplifiers operating class AB or A have been biased from a temperature compensating network consisting of a forward biased semiconductive diode junction supplied with current from a constant current source to derive a temperature compensating $V_{BE}$ voltage drop thereacross serving as the source voltage for the bias potential to be supplied to the transistor to be biased. An adjustable voltage divider network was connected in parallel with the diode junction and a relatively large fraction of the diode drop was derived from the voltage divider and applied across the base-to-emitter junction of the RF transistor for biasing same.

While the aforecited prior art bias circuit compensates for the drop in $V_{BE}$ of the biased transistor as a function of increasing temperature, it failed to compensate for the increase of $h_{FE}$ with increasing temperature. As a consequence, the quiescent operating point of the biased transistor was temperature dependent, requiring a less than optimum setting of the operating point at low temperature to compensate for the increase in operating point at high temperature.

Due to the recent emphasis on RF single side band transmission, low level amplitude modulation and data transmission, large signal class AB linear RF transistor amplifier circuits are being designed for frequency ranges up through 1 GHz. The bias circuitry for class AB operation, aside from compensating for the drop in $V_{BE}$ of the transistor as a function of increasing temperature, must also provide voltage/current capability compatible with the static (zero rf drive) collector current requirements of the amplifier, and provide a low impedance voltage source with sufficient current capability to counter the negative rectification effect of the RF drive on the base of the transistor.

SUMMARY OF THE PRESENT INVENTION

The principal object of the present invention is the provision of an improved temperature compensating transistor bias device.

In one feature of the present invention, the base-to-emitter bias for a transistor is derived across a forward biased diode junction and applied across the base-to-emitter junction of the transistor being biased via the intermediary of a positive temperature coefficient resistor having a sufficient temperature coefficient to compensate for the positive temperature coefficient of $h_{FE}$ of the transistor being biased.

In another feature of the present invention, the transistor bias device includes a semiconductive diode and a positive temperature coefficient resistor, both being contained within a common package in heat exchanging relation with a heat sinking structure to which the transistor to be biased is also mounted in heat exchanging relation.

In another feature of the present invention, the temperature compensating semiconductive diode of the bias device is formed by a silicon transistor structure wherein the base and collector terminals are connected together such that the transistor structure functions as a diode, whereby the base-to-emitter voltage drop of the temperature compensating diode will have a similar temperature dependence as the base-to-emitter junction of the transistor being biased.

In another feature of the present invention, the positive temperature coefficient resistor of the semiconductive bias device is formed by a silicon semiconductive body having a relatively thin relatively low conductivity layer of n-type material formed overlaying a higher conductivity layer of n-type material, such that the resistance of the resistor is determined by the thickness of the low conductivity layer intervening between electrical connections made to opposite sides of the semiconductive body.

Other features and advantages of the present invention will become apparent upon a perusal of the following specification taken in connection with the accompanying drawings wherein:

BRIEF DESCRIPTION OF THE DRAWINGS

FIG. 1 is a schematic simplified circuit diagram of a prior art transistor bias circuit, FIG. 2 is a simplified schematic circuit diagram of a transistor bias device incorporating features of the present invention, FIG. 3 is a plot of source resistance $R_s$ and source voltage $E_s$ versus case temperature $T_c$ for the semiconductive transistor bias device of the present invention, FIG. 4 is a plot of output bias voltage $V_{SR}$ versus output bias current $I_s$ as a function of case temperature $T_c$ for the transistor bias device of the present invention.

DESCRIPTION OF THE PREFERRED EMBODIMENTS

Figure 5:
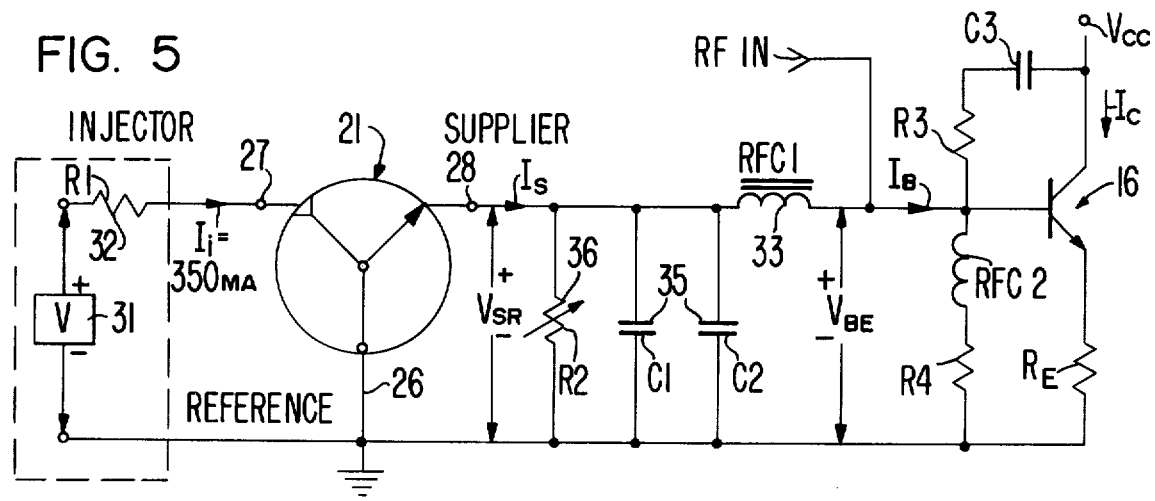
FIG. 5 is a schematic circuit diagram of a class AB amplifier bias circuit incorporating features of the present invention.

Referring now to FIG. 1 there is shown the prior art temperature compensating transistor bias network 11. In the network 11, current from a constant current source 12 of a value falling within the range of 100 to 200 milliamps, for example, is injected into a semiconductive diode 13 to develop a $V_{BE}$ voltage drop thereacross. A voltage divider network consisting of resistor 14 and resistor potentiometer 15 is connected in parallel with the diode 13. The total value of resistance of resistors 14 and 15 is selected such that approximately 10 milliamps of the total 100 to 200 milliamps derived from current source 12 flows through the parallel branch consisting of resistors 14 and 15. The relative values of resistances of resistor 14 and potentiometer 15 are selected such that approximately 1 milliamp of the 10 milliamp current flows through the base-to-emitter junction of a transistor 16 to be biased.

Collector voltage $V_{CC}$ is supplied to terminal 17 of the transistor 16. The base drive current to transistor 16 is adjusted via an adjustable potentiometer 15. The base drive current is typically chosen to produce a quiescent collector current $I_c$, at a typical operating temperature of 30° C., of approximately 50 milliamps. The heat sink to which the compensating diode 13 and transistor 16 are mounted is then heated to approximately 100° C. The quiescent collector current of transistor 16 is then measured and this collector current should be less than three times the collector current measured at 30° C., namely less than 150 milliamps. If the collector current is greater than 150 milliamps, i.e. greater than three times the 30° C. quiescent value, then the base drive current is too great and potentiometer 15 is adjusted to reduce the quiescent base drive level. If cross-over distortion is detected when the transistor amplifier 16 is operated in class AB, the base drive level is too low and potentiometer 15 is adjusted to increase the base drive level.

While the prior art transistor bias circuit of FIG. 1 provides a drop in the base-to-emitter bias voltage supplied to transistor 16 as a function of increasing temperature so as to eliminate the possibility of dc thermal runaway of transistor amplifier 16, the circuit fails to compensate for temperature dependent changes in $h_{FE}$ of transistor 16. $h_{FE}$ typically has a positive temperature coefficient of approximately 0.5% per degree C.

Referring now to FIG. 2 there is shown the semiconductive transistor bias device 21 of the present invention. The device includes a semiconductive diode 22 which is a transistor preferably having a configuration similar to that of the transistor 16 to be biased. More particularly, the transistor, as more fully disclosed below, has its base and collector conductively connected together such that the transistor operates as a diode. The base, collector and emitter regions of the diode 22 are made as similar as possible to those of the transistor 16 to be biased, such that the base-to-emitter characteristics of the diode 22 will be similar to those of the transistor 16 to be biased for improved thermal tracking.

Current from a constant current source 12 is injected through the diode 22 such that the base-to-emitter voltage drop $V_{BE}$ across the diode 22 serves as a source of bias voltage $E_s$ to be applied across the base-to-emitter junction of the transistor 16 to be biased. This bias voltage $E_s$ is applied across the base-to-emitter junction of the transistor 16 to be biased via the intermediary of a silicon resistor 23 having a positive temperature coefficient of a sufficient magnitude to compensate for the positive temperature coefficient of $h_{FE}$ of the transistor 16 to be biased.

The silicon resistor 23 and diode 22 are both mounted within a transistor package 24 in heat exchanging relation with a heat sink structure 25 common to the transistor amplifier 16 to be biased. Reference terminals 26 are brought out from the package 24, such reference terminals 26 being electrically isolated from the heatsink 25 for bias of a class A amplifier, as more fully disclosed below in FIG. 6. Thus, the bias device package 24 includes an injector terminal 27 to which the constant current source 12 is connected and an output supplier terminal 28 to which the base electrode of the transistor 16 to be biased is connected. In a typical example, 350 milliamps of current from source 12 is injected into injector terminal 27 to supply approximately 1 milliamp of base current via supplier terminal 28 to the base of the transistor 16 to be biased.

Referring now to FIG. 3 there is shown the operating characteristics for the transistor bias device 21 versus temperature. The voltage $E_s$ derived across the base-to-emitter junction of the temperature compensating diode 22 decreases with increasing temperature from a potential of approximately 0.82 volt at 25° C. to approximately 0.73 volt at 100° C., whereas the resistance $R_s$ of the silicon resistor 23, which forms the major portion of the source resistance of the bias device 21, increases with increasing temperature from approximately 0.82 ohm at 25° C. to 1.10 ohms at 100° C. By inserting a constant current into the injector terminal 27, the diode 22 acts as a voltage source with approximately 0.3 ohm source impedance. The addition of the silicon resistor 23 (approximately 0.7 ohm) increases the apparent source impedance of the transistor bias device 21 to approximately 1 ohm.

The silicon resistor 23 increases in resistance, and the diode voltage drop across diode 22 decreases with increasing temperature. As a result, the source impedance of the transistor bias device 21 increases, and the bias voltage decreases with increasing temperature as shown in FIGS. 3 and 4.

Thus, by mounting the transistor bias device 21 on the same heat sink as that employed for the RF transistor 16, the transistor bias device will thermally track the transistor 16 and compensate for its reduction in $V_{BE}$ and increase in $h_{FE}$. The result is improved D.C. stability of the amplifier 16 and elimination of D.C. thermal runaway of the RF transistor.

Referring now to FIG. 5 there is shown a transistor bias device 21 as connected in circuit for biasing an RF power transistor amplifier 16 for class AB operation. Approximately 350 milliamps of current is injected into injector terminal 27 from a source of voltage 31 through a source impedance 32. The resistance of source impedance 32 is high compared to any of the resistance to be encountered in the bias circuitry such that current injected at terminal 27 appears to come from a constant current generator. The supplier terminal 28 is connected to the base of the RF transistor 16 through a radio frequency choke 33. Radio frequency energy to be amplified is fed to the base of the transistor 16 intermediate the RF choke 33 and the base electrode. Bypass capacitors C1 and C2 are connected in shunt across the supplier-to-reference terminals of the bias device 21.

A variable resistor 36 is also connected in shunt across the supplier and reference terminals of the bias device 21. The resistance of adjustable resistor 36 is adjusted until a desired static collector current $I_C$ for transistor 16 is achieved. Increasing the resistance of adjustable resistor 36 increases $V_{BE}$ derived across terminals 28 and 26 and thereby increases the static collector current $I_C$ of the transistor 16. Once the desired static quiescent collector current $I_C$ is achieved, no further adjustments are required of the circuit. The circuit will automatically provide the appropriate static collector current, provide a low impedance DC voltage source $V_{SR}$, and thermally track the RF transistor 16 and compensate for temperature changes, thereby eliminating D.C. thermal runaway problems.

Figure 6:
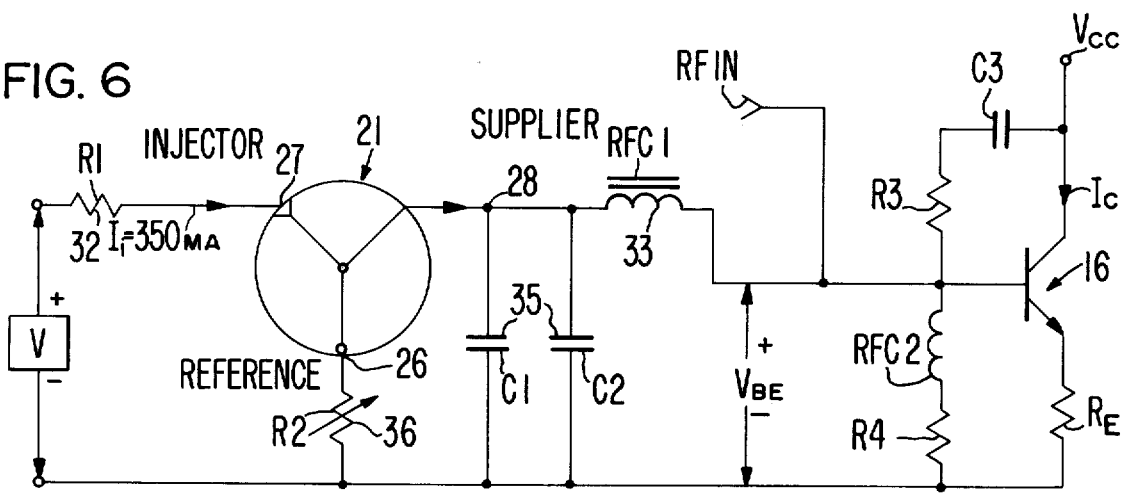
FIG. 6 is a schematic circuit diagram for a class A amplifier bias circuit incorporating features of the present invention.

Referring now to FIG. 6 there is shown a bias circuit similar to that of FIG. 5 but arranged for class A operation of the RF transistor amplifier 16. The circuitry of FIG. 6 is substantially the same as that of FIG. 5 with the exception that the adjustable resistor 36 is moved to be in series between RF ground and the reference terminal 26. In the circuit of FIG. 6, the initial setting of the bias point for the RF transistor amplifier 16 is achieved by varying the resistance of resistor 36 until the desired value of quiescent collector current $I_C$ is reached. Increasing the value of resistor 36 increases $I_C$.

Figure 7:
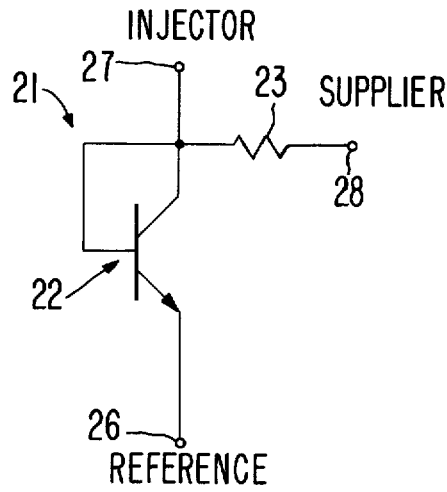
FIG. 7 is a schematic circuit diagram of a transistor connected as a diode and incorporating features of the present invention.

Referring now to FIG. 7 there is shown the equivalent circuit for the transistor bias device 21. As above described, the diode 22 comprises a transistor having its base and collector terminals electrically connected together to form an effective diode structure where the diode is formed by the base-to-emitter junction of the transistor structure. The silicon resistor 23 is connected between the collector of the transistor structure and the supply terminal 28.

Figure 8:
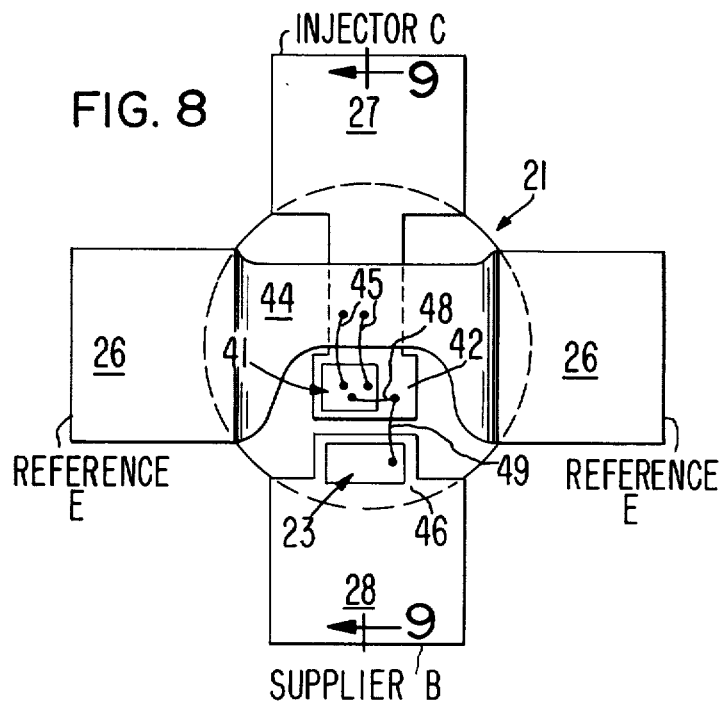
FIG. 8 is a schematic plan view of a packaged transistor bias device incorporating features of the present invention.
Figure 9:
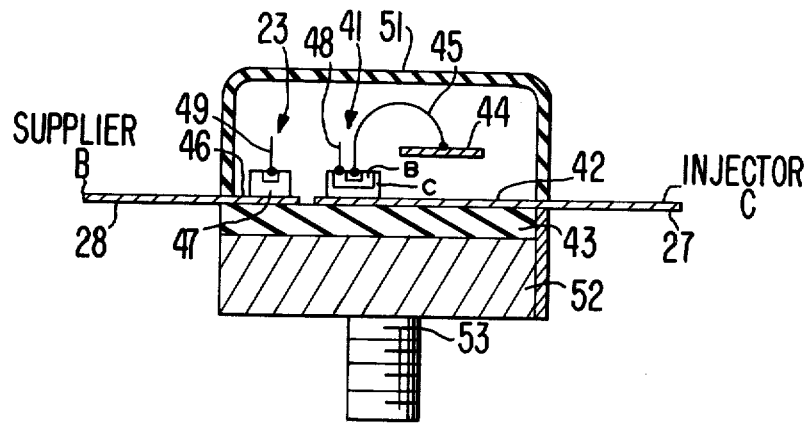
FIG. 9 is a sectional view of the structure of FIG. 8 taken along line 9—9 in the direction of the arrows.

Referring now to FIGS. 8 and 9, there is shown a physical realization of the transistor bias device 21, as shown in FIG. 7. A transistor die 41 of conventional design for high power RF use, and consisting of interdigitated base and emitter regions and interdigitated metallized electrode contacts, is mounted overlaying a metallized collector lead 42 (injector lead) deposited on the upper surface of a thermally conductive ceramic insulator plate 43, as of beryllia or alumina. The reference terminal strip conductors 26 are bonded overlaying the ceramic plate 43 at opposite edges and the opposite edges are connected via an electrically conductive bridge portion 44 extending over the injector electrode 42 in insulative relation therewith. Emitter leads 45 interconnect the bridge 44 and the emitter electrode pads of the transistor die 41. The supplier terminal 28 is connected to a metallized lead portion 46 overlaying the insulative plate 43.

Figure 10:
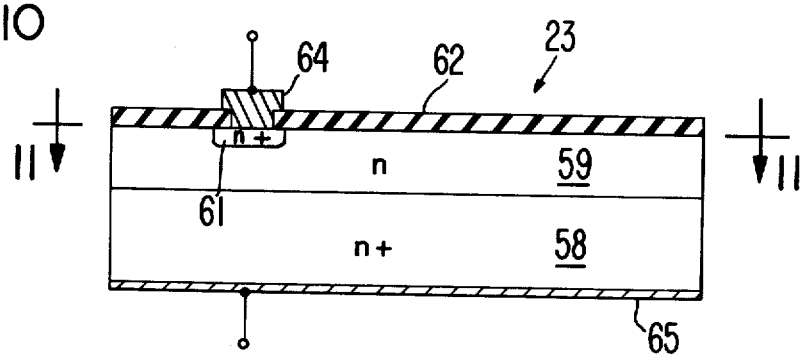
FIG. 10 is a schematic transverse sectional view through a silicon resistor employed in the transistor bias device of the present invention.
Figure 11:
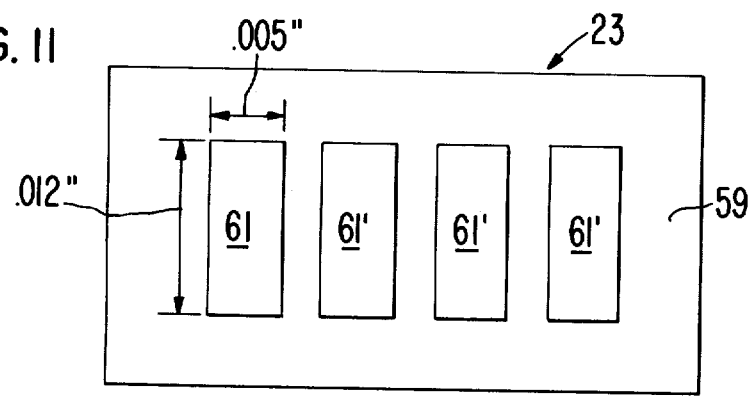
FIG. 11 is a plan view of the structure of FIG. 10 taken along line 11—11 in the direction of the arrows.

The silicon resistor semiconductive body 47, more fully disclosed below in FIGS. 10 and 11, is bonded to the upper surface of the supplier lead 46. The base pad portion of the transistor die 41 is connected to the collector pad portion via the intermediary of a lead 48 and the other terminal of the resistor 23 is connected to the collector lead 42 via lead 49. A hermetically sealed ceramic cover or cap 51 is sealed over the ceramic plate 43 and leads 26, 27 and 28.

The ceramic plate 43 is brazed to an underlying upper surface of a heat sink plate or stud 52 which includes a dependent stud portion 53 or other suitable mounting means for mounting the heat sink structure 52 to the heat sink structure to which the amplifier 16 is mounted. In this manner the transistor bias device 21 is mounted in heat exchanging relation with the transistor 16 for thermal tracking thereof.

Referring now to FIGS. 10 and 11 there is shown the silicon resistor 23 employed in the transistor bias device 21 of the present invention. The resistor 23 includes a semiconductive main body portion 58, as of silicon, doped with a suitable n-type dopant to a carrier concentration sufficient to cause layer 58 on the main body to have n+ conductivity. An epitaxial layer 59 of n-type material, i.e. n-doped silicon, is grown overlaying the subregion 58. The thickness of layer 59 is precisely controllable and is controlled to define the resistance of resistor 23. In a typical example the n layer 59 has a conductivity of 1 ohm-centimeter and has a thickness as of 10 microns. As n+ region 61 is diffused into the n layer 59 for making electrical contact to the n layer 59.

An insulative layer 62 is deposited overlaying the n layer 59 and a metallic contact 64 is deposited through a window in the insulative layer 62 for making contact to the n+ layer region 61.

The plan view area of the n+ region 61 determines the amperage that can be safely carried by the resistor 23. In a typical example, the n+ region 61 has a width as of 0.005 inch and a length as of 0.012 inch and will handle one ampere of current without exceeding the current carrying capabilities of the resistor 23. One resistor connection of the aforecited dimensions provides a resistance of approximately 0.75 ohm. The current carrying capability of the resistor 23 is increased by diffusing additional n+ regions 61' into the semiconductive layer 59 as indicated in FIG. 11. Electrical connection is then made to the regions 61 and they are connected in parallel with each other for increasing the current carrying capability of the resistor 23. A gold contact layer 65 makes ohmic contact to the opposite side of the n+ region 58.

In a typical case, resistor 23 has a resistance somewhere within the range of 0.5 ohm to 30 ohms dependent upon the parameters of the transistor 16 to be biased. Silicon resistor 23 has a positive temperature coefficient of approximately 0.4% and preferably has a value falling within the range of 0.2% to 1.2% per degrees C. The temperature coefficient of the base-to-emitter junction of the transistor 16 to be biased normally has a value of approximately minus 2 millivolts per degrees C. and generally falling within the range of minus 1.2 to 2.5 millivolts per degrees C. Furthermore, the diode junction of the compensating diode 22 should preferably have a junction area of a value nearly of the same value as and at least 1/10th of the base-to-emitter diode junction area of the transistor 16 to be biased.

What is claimed is:

1. In a semiconductive device for providing a temperature compensated bias output to be applied across the base-to-emitter junction of a transistor to be biased:

a semiconductive body having first and second abutting regions therein of different conductivity type material to define a p-n diode junction therebetween;

first and second electrode means for making electrical connection to said first and second regions, respectively, of said semiconductive body;

injector, reference, and supplier terminal means for making electrical connections to electrical circuitry, means electrically connecting said injector terminal means and said first electrode means, means electrically interconnecting said reference terminal means and said second electrode means;

resistor means having a positive temperature coefficient of resistance of sufficient magnitude to compensate for an increasing temperature coefficient of $h_{FE}$ of the transistor to be biased, means for electrically connecting said resistor means between said supplier terminal means and said injector terminal means; and means for mounting said semiconductive body and said resistor means in heat exchanging relation with the transistor to be biased to provide a temperature compensated bias potential across said supplier and reference terminal means as an output to be applied in circuit with the base-to-emitter junction of the transistor to be biased.

2. The apparatus of claim 1 including, package means for enclosing said semiconductive body and said resistor means, and wherein said mounting means includes means for mounting said package means in heat exchanging relation with the transistor to be biased.

3. The apparatus of claim 1 wherein said semiconductive body is made of silicon.

4. The apparatus of claim 1 wherein said resistor means is made of silicon.

5. The apparatus of claim 2 wherein said package means includes, thermally conductive heat sinking structure to be mechanically coupled in heat exchanging relation with said transistor to be biased, a thermally conductive ceramic substrate structure overlaying said heat sinking structure in heat exchanging relation therewith, and said resistor means and said semiconductive body being mounted overlaying said substrate structure in heat exchanging relation therewith.

6. The apparatus of claim 1 wherein the area of said diode junction region of said semiconductive body is at least 1/10th the area of the base-to-emitter junction area of the transistor to be biased.

7. The apparatus of claim 1 wherein said resistor means comprises a second semiconductive body having first and second abutting layers of first and second conductivity, respectively, and of the same type conductivity, means for making electrical connection to opposite sides of said first and second layers of said same type conductivity layers, said second conductivity being at least five times greater than the conductivity of said first conductivity such that the resistance between said electrical connection means as established by the path through said first and second abutting layers is predominantly determined by the thickness of said first layer intervening between said electrical connection means.

8. The apparatus of claim 7 wherein said second semiconductive body is made of silicon, and wherein both of said first and second layers are of n-type conductivity.

9. The apparatus of claim 1 wherein said semiconductive body includes a third region abutting said second region and being of a conductivity type the same as said first region to define a second p-n junction at the interface of said second and third regions, third electrode means for making connection to said third region, and means for electrically interconnecting said second electrode means and said third electrode means for shunting said second p-n junction, whereby said three region semiconductive device is caused to operate as a diode.

10. The apparatus of claim 1 including, constant current source means connected across said injector and reference terminal means for supplying constant current through said diode junction.

11. The apparatus of claim 1 wherein said resistor means has a positive temperature coefficient of resistance of a value falling within the range of 0.2% to 1.2% per degree C.

12. The apparatus of claim 11 wherein said diode junction has a voltage drop thereacross with constant current drive therethrough that has a negative temperature coefficient falling within the range of 1.2 to 2.5 millivolts per degree C.

13. The apparatus of claim 11 wherein said resistor means has a value of resistance falling within the range of 0.4 ohm to 30 ohms.

14. In a method for temperature compensation and biasing of the base-to-emitter junction of a transistor the steps of:

feeding a current through a diode p-n junction of a semiconductive body to derive a potential drop thereacross to serve as the source of a bias potential to be fed to the base-to-emitter junction of a transistor to be biased;

feeding the derived bias potential across the base-to-emitter junction of the transistor to be biased via the intermediary of a positive temperature coefficient resistance of sufficient magnitude to compensate for an increasing temperature coefficient of $h_{fe}$ of the transistor to be biased; and mounting said semiconductive body and said resistance in heat exchanging relation with the transistor being biased to provide a temperature compensated bias potential to the base-to-emitter junction of the transistor being biased.

15. The method of claim 14 wherein the step of feeding the current through the diode p-n junction comprises feeding a constant current through said diode junction.

16. The method of claim 14 wherein the positive temperature coefficient resistance has a positive temperature coefficient value falling within the range of 0.2% to 1.2% per degree centigrade.

17. The method of claim 15 wherein the bias potential developed across the p-n junction with constant current flow therethrough has a negative temperature coefficient falling within the range of 1.2 to 2.5 millivolts per degree centigrade.

18. The method of claim 16 wherein the positive temperature coefficient resistance has a value of resistance falling within the range of 0.4 ohms to 30 ohms.

* * * * *